(12) United States Patent
Tao et al.

(10) Patent No.: US 9,595,490 B2
(45) Date of Patent: Mar. 14, 2017

(54) 3D SYSTEM-LEVEL PACKAGING METHODS AND STRUCTURES

(75) Inventors: Yujuan Tao, Nantong (CN); Lei Shi, Nantong (CN)

(73) Assignee: NANTONG FUJITSU MICROELECTRONICS CO., LTD., Nantong (CN)

( * ) Notice: Subject to any disclaimer, the term of this patent is extended or adjusted under 35 U.S.C. 154(b) by 0 days.

(21) Appl. No.: 13/984,876

(22) PCT Filed: Mar. 22, 2012

(86) PCT No.: PCT/CN2012/072765
§ 371 (c)(1),
(2), (4) Date: Aug. 12, 2013

(87) PCT Pub. No.: WO2012/126374
PCT Pub. Date: Sep. 27, 2012

(65) Prior Publication Data
US 2013/0320533 A1     Dec. 5, 2013

(30) Foreign Application Priority Data

Mar. 22, 2011 (CN) .......................... 2011 1 0069846
Mar. 22, 2011 (CN) .......................... 2011 1 0069849
(Continued)

(51) Int. Cl.
*H01L 23/48* (2006.01)
*H01L 23/498* (2006.01)
(Continued)

(52) U.S. Cl.
CPC ........ *H01L 23/49816* (2013.01); *H01L 21/50* (2013.01); *H01L 23/5389* (2013.01);
(Continued)

(58) Field of Classification Search
CPC ....... H01L 25/0657; H01L 2924/15311; H01L 2924/01079; H01L 2224/48091
(Continued)

(56) References Cited

U.S. PATENT DOCUMENTS

2005/0029644 A1*  2/2005  Ho et al. ........................ 257/686
2005/0046002 A1*  3/2005  Lee ................... H01L 21/76898
                                             257/678
(Continued)

FOREIGN PATENT DOCUMENTS

CN          2664198 Y      2/2004
CN          1521816 A      8/2004
(Continued)

*Primary Examiner* — Cuong Q Nguyen
*Assistant Examiner* — Nishath Yasmeen
(74) *Attorney, Agent, or Firm* — Anova Law Group, PLLC

(57) ABSTRACT

A 3D system-level packaging method includes providing a packaging substrate having a first functional surface and a second surface with wiring arrangement within the packaging substrate and between the first functional surface and the second surface. The method also includes forming at least one flip package layer on the first functional surface of the packaging substrate and forming at least one wiring and package layer on the flip package layer. The flip package layer is formed by subsequently forming a flip mounting layer, an underfill, a sealant layer, and a wiring layer; and the wiring and package layer is formed by subsequently forming a straight mounting layer, a sealant layer, and a wiring layer. Further, the method includes planting connection balls on the second functional surface of the packaging substrate.

19 Claims, 6 Drawing Sheets

(30) Foreign Application Priority Data

Mar. 22, 2011 (CN) .......................... 2011 1 0069978
Mar. 22, 2011 (CN) .......................... 2011 1 0069980

(51) Int. Cl.
*H01L 23/538* (2006.01)
*H01L 23/00* (2006.01)
*H01L 21/50* (2006.01)

(52) U.S. Cl.
CPC .............. *H01L 24/24* (2013.01); *H01L 24/73* (2013.01); *H01L 2224/16225* (2013.01); *H01L 2224/16227* (2013.01); *H01L 2224/24226* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/73267* (2013.01); *H01L 2924/01029* (2013.01); *H01L 2924/15192* (2013.01); *H01L 2924/15311* (2013.01); *H01L 2924/19105* (2013.01)

(58) Field of Classification Search
USPC ................................................. 257/666–796
See application file for complete search history.

(56) References Cited

U.S. PATENT DOCUMENTS

| | | | |
|---|---|---|---|
| 2005/0236696 A1* | 10/2005 | Yang | H01L 21/561 257/659 |
| 2007/0262436 A1 | 11/2007 | Kweon et al. | |
| 2009/0039523 A1* | 2/2009 | Jiang et al. | 257/777 |
| 2009/0152715 A1* | 6/2009 | Shim et al. | 257/737 |
| 2009/0160053 A1* | 6/2009 | Meyer | H01L 21/568 257/738 |
| 2010/0019359 A1* | 1/2010 | Pagaila | H01L 21/568 257/659 |
| 2010/0133682 A1* | 6/2010 | Meyer | H01L 21/568 257/698 |
| 2011/0140283 A1* | 6/2011 | Chandra | H01L 23/5385 257/777 |
| 2011/0186977 A1* | 8/2011 | Chi | H01L 25/0657 257/686 |

FOREIGN PATENT DOCUMENTS

| | | |
|---|---|---|
| CN | 1707792 A | 12/2005 |
| JP | 2008042063 A | 2/2008 |

* cited by examiner

3D SYSTEM-LEVEL PACKAGING METHODS AND STRUCTURES

CROSS-REFERENCES

This application claims the priority of Chinese patent application no. 201110069980.7, filed on Mar. 22, 2011, Chinese patent application no. 201110069849.0, filed on Mar. 22, 2011, Chinese patent application no. 201110069846.7, filed on Mar. 22, 2011, and Chinese patent application no. 201110069978.X, filed on Mar. 22, 2011, the entire contents of all of which are incorporated herein by reference.

FIELD OF THE INVENTION

The present invention generally relates to semiconductor technologies and, more particularly, to the methods and structures for system-level semiconductor packaging.

BACKGROUND

With the continuous development of integrated circuit (IC) technologies, the development trend for electronic products is moving towards more miniaturized and intelligent structures with high performance and high reliability. IC packaging not only has a direct impact on the performance of the integrated circuits, electronic modules, and even the systems, but also restricts the miniaturization, low-cost, and reliability of electronic systems. As the IC chip size keeps decreasing and the integration degree keeps increasing, higher and higher requirements for IC packaging technology are raised by the electronics industry.

Chinese patent publication number CN1747156C discloses a circuit integration wafer. The disclosed circuit integration wafer includes: a substrate having a surface; a ball pad located on the substrate surface; a solder mask layer formed on the surface of the substrate, with at least one opening to expose the ball pad; and a patterned metal reinforcing layer formed on the ball pad along the sidewall of the solder mask layer opening. However, when such circuit integration wafer is used, the system-level packaging integration degree may be still undesired.

On the other hand, with the trend for light, thin, short, and small products as well as increasingly high demand for system-level functionalities, the integration degree of system-level packaging needs to be further improved. The disclosed methods and systems are directed to solve one or more problems set forth above and other problems.

BRIEF SUMMARY OF THE DISCLOSURE

One aspect of the present disclosure includes a 3D system-level packaging method. The method includes providing a packaging substrate having a first functional surface and a second surface with wiring arrangement within the packaging substrate and between the first functional surface and the second surface. The method also includes forming at least one flip package layer on the first functional surface of the packaging substrate and forming at least one wiring and package layer on the flip package layer. The flip package layer is formed by subsequently forming a flip mounting layer, an underfill, a sealant layer, and a wiring layer; and the wiring and package layer is formed by subsequently forming a straight mounting layer, a sealant layer, and a wiring layer. Further, the method includes planting connection balls on the second functional surface of the packaging substrate.

Another aspect of the present disclosure includes a 3D system-level packaging structure. The 3D system-level packaging structure includes a packaging substrate having a first functional surface and a second surface with wiring arrangement within the packaging substrate and between the first functional surface and the second surface. The packaging structure also includes at least one flip package layer formed on the first functional surface of the packaging substrate and at least one wiring and package layer formed on the flip package layer. The flip package layer further includes a flip mounting layer, an underfill, a sealant layer, and a wiring layer; and the wiring and package layer further includes a straight mounting layer, a sealant layer, and a wiring layer. Further, the packaging structure includes connection balls planted on the second functional surface of the packaging substrate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
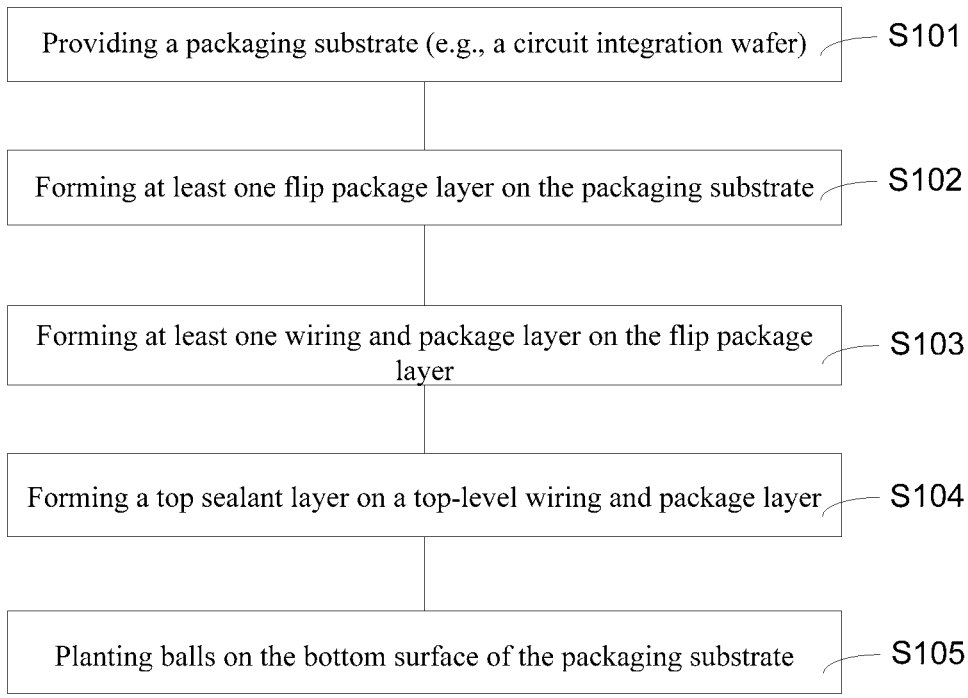
FIG. 1 illustrates an exemplary system-level packaging process consistent with the disclosed embodiments.
Figure 4:
FIGS. 4-13 illustrate exemplary packaging structures corresponding to various steps in the system-level packaging process consistent with the disclosed embodiments.

FIG. 1 illustrates an exemplary 3D system-level packaging process consistent with the disclosed embodiments. The term 3D, as used herein, refers to multiple layers of components are vertically arranged and packaged together. As shown in FIG. 1, at the beginning of the process, a packaging substrate is provided (S101). FIG. 4 is an exemplary structure corresponding to S101.

As shown in FIG. 4, a packaging substrate 101 is provided. The packaging substrate 101 may include any appropriate type of substrate for semiconductor packaging, such as a BT (Bismaleimide Triazine) substrate or a PCB (Printed Circuit Board) substrate. In certain embodiments, the packaging substrate 101 may be a circuit integration wafer. The circuit integration wafer may include any appropriate material used for 3D packaging, such as pure silicon, silicon with certain impurity doping, and other semiconductor material. Substrate 101 may be configured as the base for subsequently stacking package layers and may also be configured as the base for carrying (i.e., carrier) any other subsequent layers of the system-level packaging structure.

Further, substrate 101 (e.g., a circuit integration wafer) may include two functional surfaces, a first functional surface and a second functional surface. The first functional surface of the substrate 101 may be used for stacking the package layers; and the second functional surface may be used for planting balls (i.e., connection balls). In certain embodiments, the first surface is an upper surface of the substrate 101 and the second surface is a bottom surface of the substrate 101. Further, the upper surface and bottom surface are configured to have pads for electrical connection. The pads (e.g., bonding pads) on the upper surface and bottom surface can be interconnected through wiring arrangement inside the substrate 101. Further, pad distance (i.e., a distance between neighboring pads to indicate density of the pads) on the upper surface of substrate 101 may be less than the pad distance on the bottom surface such that the upper surface is configured with dense pad population to suite high precision and high integration degree of semiconductor chips, while the bottom surface is configured with large pad distance to suite surface mount technology (SMT) requirements. Thus, the packaging substrate 101 not only provides wiring arrangement to subsequent package layers, but also acts as a bridge between the chip manufacturing technology and device mounting technology.

Further, the packaging substrate 101 may facilitate the 3D high-density packaging by providing desired wiring and interconnects to integrate various chips and other components, both vertically and horizontally. The wiring or interconnects may be arranged between the upper surface and bottom surface and within the substrate 101, i.e., between the pads on the upper surface and the pads on the bottom surface. More particularly, the wiring between the upper surface and bottom surface may be carried using through-Si via (TSV) technology.

Returning to FIG. 1, after the substrate 101 is provided (S101), at least one flip package layer is formed on the substrate 101 (S102). As used herein, a package layer may refer to a single functional layer of IC components to be integrated into a system-level packaging structure. The package layer may include one or more layers of structures. Further, a flip package layer may refer to a package layer with functional surface flipped when being mounted, and a wiring and package layer may refer to a package layer with functional surface facing up when being mounted.

Figure 2:
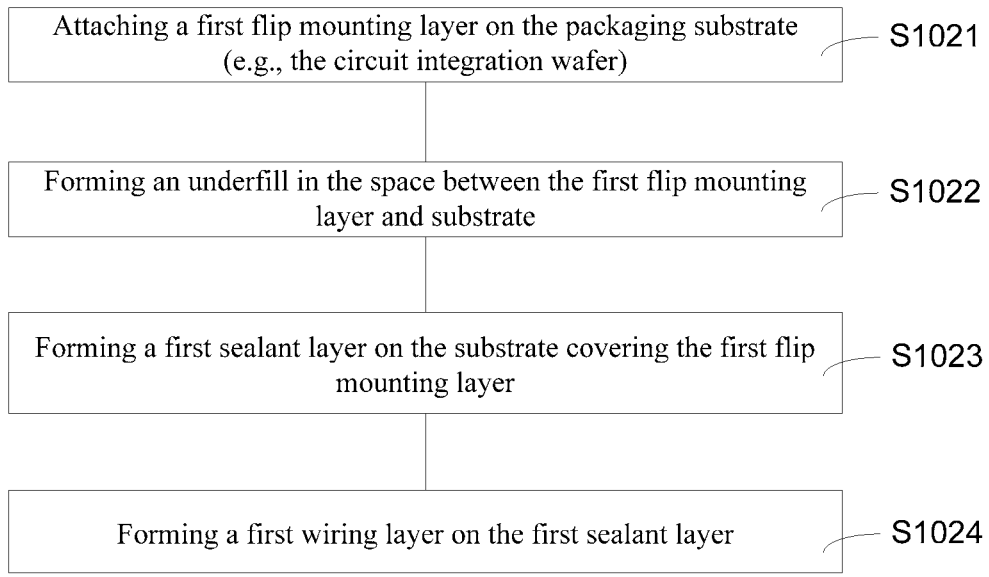
FIG. 2 illustrates an exemplary process forming a flip mounting layer consistent with the disclosed embodiments.

The flip package layer may be formed by various steps or processes. For example, FIG. 2 illustrates exemplary process steps for forming the flip package layer. Any number of package layers may be included.

Figure 5:
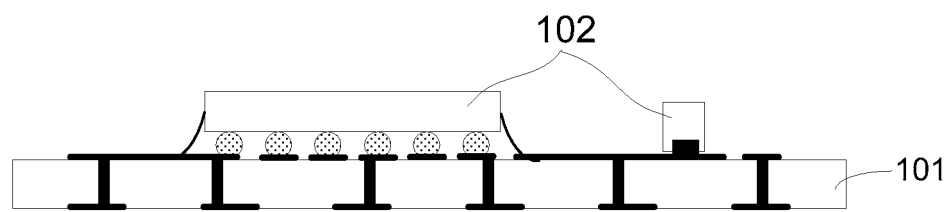

As shown in FIG. 2, to form the flip package layer, a first flip mounting layer is attached on the packaging substrate 101 (S1021). FIG. 5 shows a corresponding structure.

As shown in FIG. 5, first flip mounting layer 102 is mounted to the substrate 101. More particularly, the functional surface of chips and passive devices belonging to the first flip mounting layer 102 is attached to the substrate 101 to form the first flip mounting layer 102. The functional surface refers to the surface containing the functional solder joints of the chips (e.g., solder bumps) and bonding pads of the passive devices of the first flip mounting layer 102. The locations for mounting the chips and passive devices in the first flip mounting layer 102 are determined based on a system wiring plan. The functional solder joints of the chips and bonding pads of the passive devices of the first flip mounting layer 102 are interconnected with the bonding pads on the upper surface of the substrate 101.

The first flip mounting layer 102, as well as other mounting layers, may include a variety of semiconductor devices. For example, the first flip mounting layer 102 may include one or more same or different chips and one or more same or different passive devices, such as capacitors, resistors, and/or inductors. These chips and passive devices may become a part of a system-level packaging structure to achieve one or more separate functions from various system-level functions to be provided by the system-level packaging structure, such as a system-on-chip.

In the first flip mounting layer 102, combinations of the chip and passive devices in the first flip mounting layer 102 may be determined based on the system functions. Thus, a chip or a chip group may be surrounded by same or different other chip or chip group and/or surrounded by same or different capacitors, resistors, and inductors, etc. Similarly, a passive device may be surrounded by same or different other passive devices and/or surrounded by one or more same or different chips.

Further, the chips in the first flip mounting layer 102 may have solder bumps (not labeled) and the chips are mounted as well as electrically connected with the substrate 101 (e.g., bonding pads on the upper surface of substrate 101) through the solder bumps. Similar structures may also be used for the passive devices. The mounting direction of the passive devices may be the same as the mounting direction of the flip chip to simplify the manufacturing process.

Returning to FIG. 2, after the first flip mounting layer 102 is attached on the substrate 101 (S1021), an underfill is formed in the space between the first flip mounting layer 102 and substrate 101 (S1022). More specifically, the space between the chip in first flip mounting layer 102 and the substrate 101 is filled with a filling material to form the underfill.

In certain embodiments, the filling material forming the underfill is a polymer epoxy resin. The polymer epoxy resin may have a desired fluidity and can be used to fully fill the gap between the flip chip and the substrate 101 to avoid reliability issues such as internal voids in the subsequently formed layers. The filling material may be filled using dispensing method or other filling means.

Figure 6:
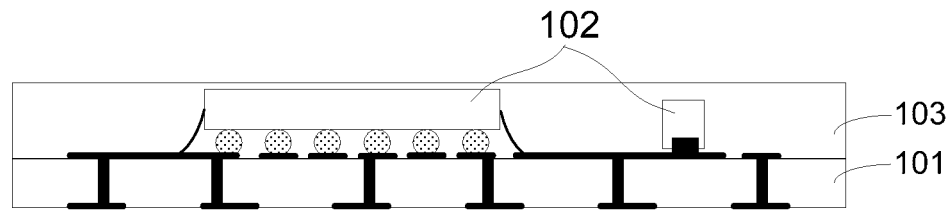

Further, a first sealant layer is formed on the substrate 101 covering the first flip mounting layer 102 (S1023). FIG. 6 shows a corresponding structure.

As shown in FIG. 6, a first sealant layer 103 is formed on top of the substrate 101 encapsulating the first flip mounting layer 102. That is, the first flip mounting layer 102 is encapsulated or sealed by the first sealant layer 103. Thus, in subsequent processes, the first sealant layer 103 not only can protect the first flip mounting layer 102, but also can be a carrier for subsequent package layers.

The first sealant layer 103 may include any appropriate material. In one embodiment, the first sealant layer 103 is epoxy. Epoxy may be a desired material for forming the first sealant layer 103 because of its high sealing performance and easy molding. Further, the first sealant layer 103 may be formed using various methods, such as turn injection, compression, or printing, etc.

Figure 7:
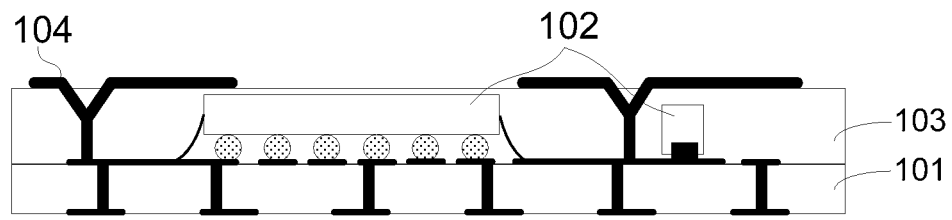

Returning to FIG. 2, after forming the first sealant layer 103, a first wiring layer is formed on the first sealant layer 103 (S1024). FIG. 7 shows a corresponding structure.

As shown in FIG. 7, first wiring layer 104 is formed on top of the first sealant layer 103. More specifically, the first wiring layer 104 may include a first vertical wiring and a first horizontal wiring. The first vertical wiring may be used to achieve electrical connections between the first flip mounting layer 102 and the substrate 101 and between the first flip mounting layer 102 and other package layers. The first horizontal wiring may be used to achieve electrical connections among components in the first flip mounting layer 102.

To form the first wiring layer 104, first vias may be formed in the first sealant layer 103 and conductive material is then filled in the first vias to form the first vertical wiring. Further, first horizontal wiring connecting the first vertical wiring is formed on the first sealant layer 103.

More particularly, the first vias may be formed by drilling the first sealant layer 103. The first vias extend through the first sealant layer 103 and expose the bonding pads on the upper surface of the substrate 101 to form interconnect channels with the substrate 101. Further, the first vias are filled with conductive material to form the first vertical wiring connecting the bonding pads on the substrate 101.

Conductive material may also be deposited on top of the first sealant layer 103 to form the first horizontal wiring connecting the first vertical wiring and components in the first flip mounting layer 102. The first horizontal wiring may be used to connect vertical wiring in the first wiring layer 104 and other wiring layers in other package layers. The conductive material may be metal, such as copper, etc. The first flip mounting layer 102, the first sealant layer 103, and the first wiring layer 104 may be referred as the first flip package layer.

Figure 3:
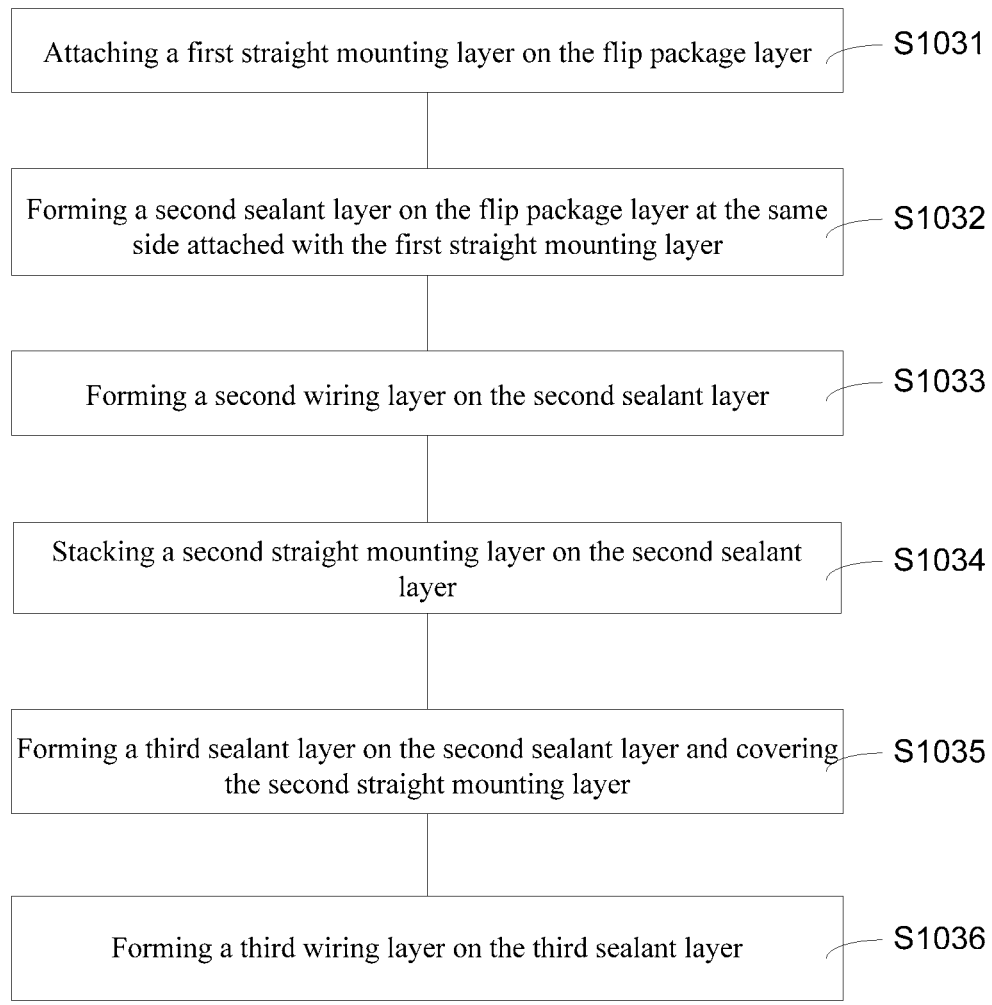
FIG. 3 illustrates an exemplary process forming two wiring and package layers consistent with the disclosed embodiments.

Returning to FIG. 1, after forming the at least one flip package layer (S102), at least one wiring and package layers are formed on the flip package layer (S103). FIG. 3 illustrates an exemplary process for forming the at least one wiring and package layer.

Figure 8:
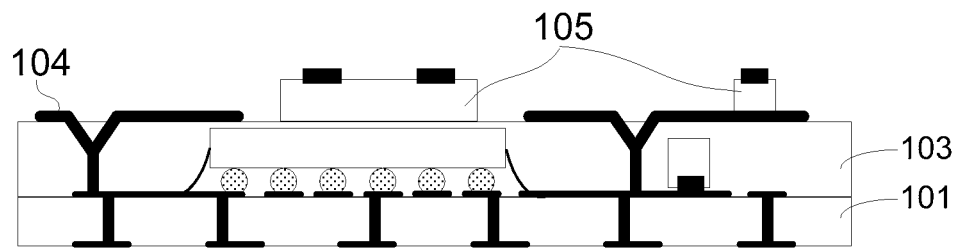

As shown in FIG. 3, a first straight mounting layer is attached on the flip package layer 102 (S1031). FIG. 8 shows a corresponding structure.

As shown in FIG. 8, a first straight mounting layer 105 is attached to the flip package layer. More particularly, the first straight mounting layer 105 is formed by attaching the chips and passive devices to the first sealant layer 103 using the surface opposite to the functional surface of the chips and passive devices. The functional surface may refer to the surface of the first straight mounting layer 105 (e.g., the chips and passive devices) having chip solder pad(s) or bonding pad(s) and passive device solder pad(s) or bonding pad(s). That is, the "straight" may refer to an arrangement of a mounting layer with the functional surface facing up. Further, the locations for attaching or affixing the chips and passive devices in the first straight mounting layer 105 are selected based on an overall system wiring plan.

Figure 9:
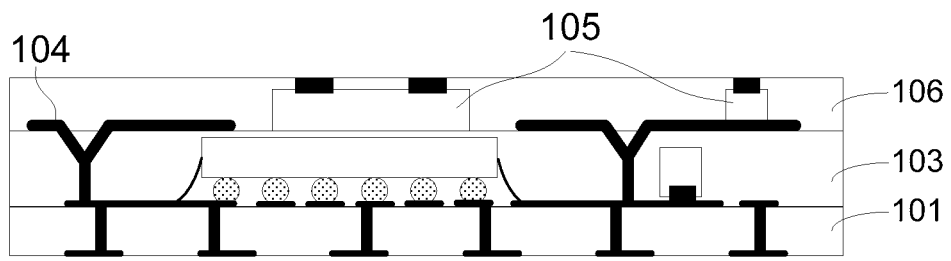

Returning to FIG. 3, after the first straight mounting layer 105 is attached on the flip package layer (S1031), a second sealant layer is formed on the flip package layer at the same side attached with the first straight mounting layer 105 (S1032). FIG. 9 shows a corresponding structure.

As shown in FIG. 9, a second sealant layer 106 is formed on top of the flip package layer, or the first sealant layer 103, covering the first straight mounting layer 105 while exposing the connection parts of the first straight mounting layer 105. That is, the second sealant layer 106 may cover and isolate or insulate components in the first straight mounting layer 105 with the connection parts of the components exposed. The exposed connection parts may include, for example, bonding pad(s) of chips and passive devices in the first straight mounting layer 105. The second sealant layer 106 may include similar material to the first sealant layer 103, such as epoxy.

Figure 10:
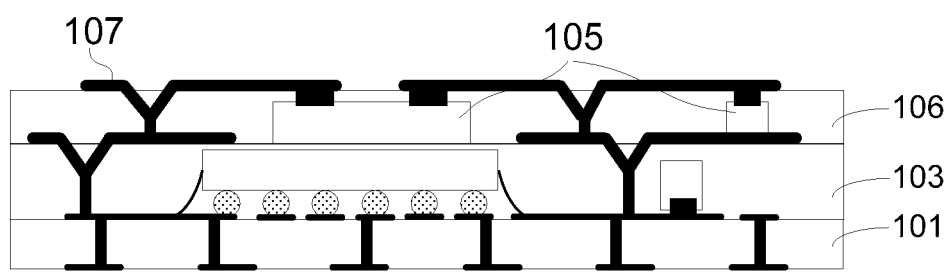

Returning to FIG. 3, after forming the second sealant layer 106, a second wiring layer is formed on the second sealant layer 106 (S1033). FIG. 10 shows a corresponding structure.

As shown in FIG. 10, the second wiring layer 107 is formed on top of the second sealant layer 106. More specifically, the second wiring layer 107 may include a second vertical wiring and a second horizontal wiring. The second vertical wiring may be metal traces or wires used to realize electrical connections between the first straight mounting layer 105 and the first flip mounting layer 102, and between the first straight mounting layer 105 and other mounting layers or package layers. The second horizontal wiring may be metal traces or wires used to realize electrical connections among components in the first straight mounting layer 105.

To form the second wiring layer 107, second vias may be formed in the second sealant layer 106 and conductive material is then filled in the second vias to form the second vertical wiring. Further, second horizontal wiring connecting the second vertical wiring is formed on the second sealant layer 106.

More particularly, the second vias may be formed by drilling. The second vias extend through the second sealant layer 106 and expose the first horizontal wiring in the first wiring layer 104 to form interconnect channels with the first flip mounting layer 102. Further, the second vias are filled with conductive material to form the second vertical wiring and the second vertical wiring is interconnected with the horizontal wiring in the first wiring layer 104. Conductive material may also be deposited on top of the second sealant layer 106 to form the second horizontal wiring connecting the second vertical wiring. The second horizontal wiring is interconnected with the various components in the first straight mounting layer 105. That is, the second horizontal wiring is connected with bonding pad(s) of the components in the first straight mounting layer 105 and the second vertical wiring. The conductive material may include any appropriate metal or non-metal material, such as copper, etc.

The sealant layer may have a same thickness as the mounting layer. Because the sealant layer has desired insulating performance, vertical wiring can be selectively formed in the sealant layer to achieve interconnect between mounting layers and between a mounting layer and the substrate 101. Interference among components in various mounting layers can be reduced or avoided. The first straight mounting layer 105, the second sealant layer 106, and the second wiring layer 107 may be referred as the first wiring and package layer or simply the first package layer.

Figure 11:
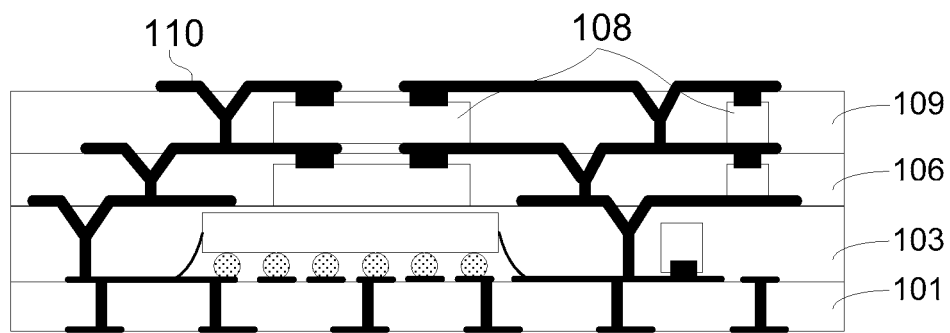

Returning to FIG. 3, after the first wiring and package layer is completed, a second straight mounting layer is stacked or attached on the second sealant layer 106 (S1034). FIG. 11 shows a corresponding structure.

As shown in FIG. 11, a second straight mounting layer 108 is stacked on the second sealant layer 106 over the second wiring layer 107. The term "stacking", as used herein, refers to placing or attaching the second straight mounting layer 108 on a predetermined location on the second sealant layer 106 over the second wiring layer 107. Further, the second straight mounting layer 108 is stacked with functional surface facing up. Similar to the first straight mounting layer 105, the second straight mounting layer 108 may include one or more same or different chips and one or more same or different passive devices.

Returning to FIG. 3, after the second straight mounting layer 108 is formed, a third sealant layer is formed on the second sealant layer 106 and covering the second straight mounting layer 108 (S1035). FIG. 11 shows the corresponding structure.

As shown in FIG. 11, third sealant layer 109 is formed on top of the second sealant layer 106 and covering the second straight mounting layer 108. The third sealant layer 109 is also formed in such a way to expose bonding pads of the chips and passive devices in the second straight mounting layer 108. The third sealant layer 109 may include material similar to other sealant layers, such as epoxy.

Further, returning to FIG. 3, a third wiring layer is formed on the third sealant layer 109 (S1036). FIG. 11 shows the corresponding structure.

As shown in FIG. 11, a third wiring layer 110 is formed on the third sealant layer 109. More specifically, the third wiring layer 110 includes a third vertical wiring and a third horizontal wiring. The third vertical wiring may be used to achieve electrical connection between the second straight mounting layer 108 and other mounting layers and between the second straight mounting layer 108 and the substrate 101. The third horizontal wiring may be used to achieve electrical connection among components of the second straight mounting layer 108.

To form the third wiring layer 110, third vias may be formed in the third sealant layer 109 and conductive material is then filled in the third vias to form the third vertical wiring. Further, third horizontal wiring connecting the third vertical wiring is formed on the third sealant layer 109. Further, the third wiring layer 110 may be formed similar to the second wiring layer 107 and the detailed descriptions are thus omitted.

The second straight mounting layer 108, the third sealant layer 109, and the third wiring layer 110 may be referred as the second wiring and package layer. Thus, the first wiring and package layer and the second wiring and package layer are completed. Further, the system interconnects among the substrate 101, the first flip package layer, the first wiring and package layer, and the second wiring and package layer are also realized using the wiring layers.

Figure 12:
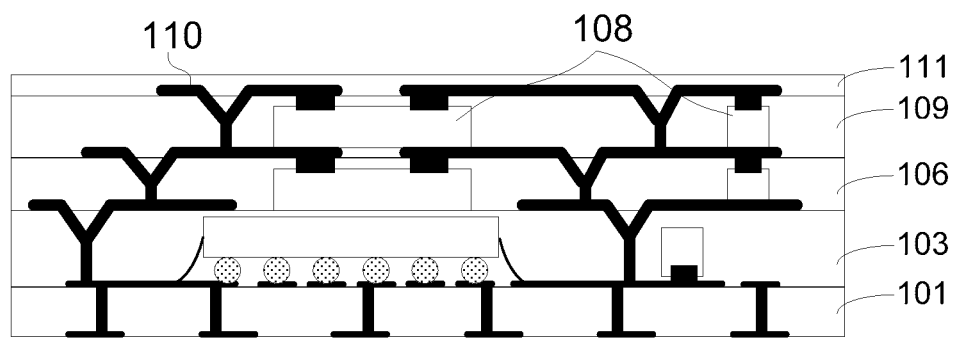

Returning to FIG. 1, after the first wiring and package layer and the second wiring and package layer are completed, a top sealant layer is formed on a top-level package layer (S104). FIG. 12 shows a corresponding structure.

As shown in FIG. 12, a top sealant layer 111 is formed on top of the third wiring layer 110 or the third sealant layer 109, because the second wiring and package layer is the top-level package layer. The top sealant layer 111 may be used to protect the third wiring layer 110 from being damaged. The material and method for forming the top sealant layer 111 may be similar to other sealant layers.

Figure 13:
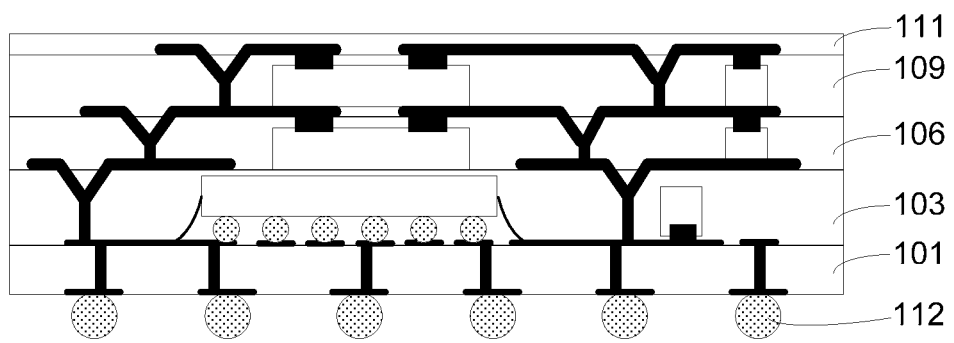

Further, returning to FIG. 1, solder balls or bumps are planted on the bottom surface of the substrate 101 (S104). FIG. 13 shows a corresponding structure.

As shown in FIG. 13, solder balls 112 are planted on the bottom surface of the substrate 101 to form the connection balls. More specifically, solder balls are planted or deposited at locations corresponding to wiring pads of the substrate 101 such that internal wiring can be outputted through the connection balls. The solder balls may include any appropriate material, such as metal tin or other types of metals.

Thus, at this point, a system-level packaging structure is formed, including the plurality of package layers with the interconnects between the plurality of package layers and substrate 101 achieved through the wiring layers. The packaging substrate 101 uses internal circuit integration wiring arrangement to complete the system integration by interconnecting various components arranged vertically and horizontally. Although three package layers (i.e., the first flip package layer, the first wiring and package layer, and the second wiring and package layer) are used for illustrative purposes, any number of package layers may be used.

Figure 14:
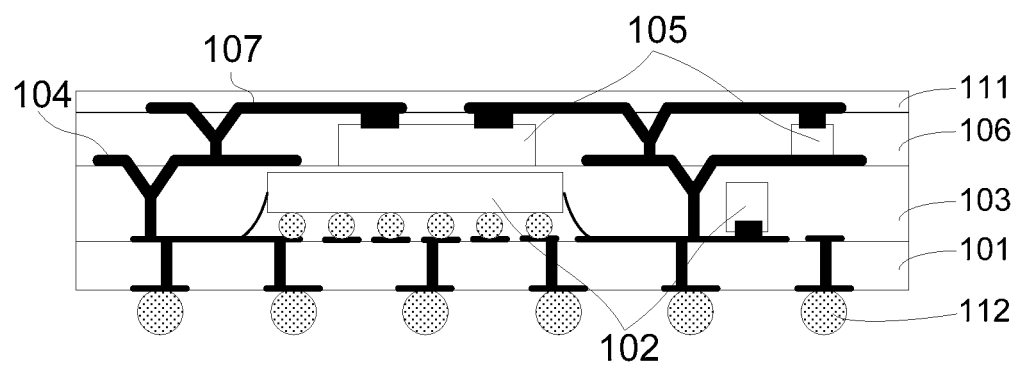
FIG. 14 illustrates another exemplary system-level packaging structure consistent with the disclosed embodiments.

For example, FIG. 14 shows a system-level packaging structure with two package layers. As shown in FIG. 14, after the second wiring layer 107 is formed, top sealant layer 111 is formed on top of the second wiring layer 107. The top sealant layer 111 may be used to protect the second wiring layer 107 from being damaged. The material and method for forming the top sealant layer 111 may be similar to other sealant layers. Thus, the system-level packaging structure includes a first flip package layer and a first wiring and package layer on top of the first flip package layer. The packaging substrate 101 provides system integration of the first flip package layer and the first wiring and package layer.

Figure 15:
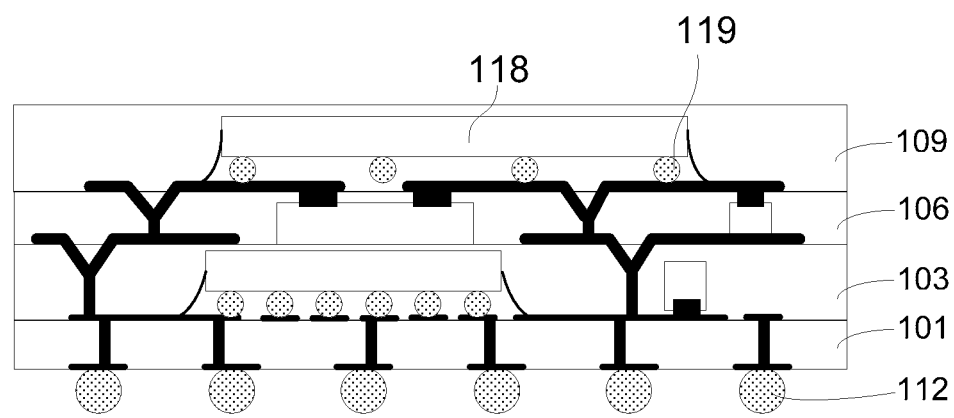
FIG. 15 illustrates another exemplary system-level packaging structure consistent with the disclosed embodiments.

Further, different types of package layers may also be used. For example, alternatively or optionally, the second wiring and package layer may be replaced by a different type of package layer in forming the system-level packaging structure. FIG. 15 illustrate another exemplary of system-level packaging structure.

As shown in FIG. 15, a top flip package layer is formed on top of the first wiring and package layer, instead of the second wiring and package layer. More particularly, a second flip mounting layer 118 is formed on the second sealant layer 106 over the second wiring layer 107. Similar to the first flip mounting layer 102, the second flip mounting layer 118 may also include various components, such as chips and/or passive device. For example, a chip is included in the second flip mounting layer 118. The chip may have solder bumps 119 to provide electrical connection between the second flip mounting layer 118 and the second wiring layer 107. More specifically, the solder bumps 119 are interconnected with the second horizontal wiring of the second wiring layer 107 such that components in the second flip mounting layer 118 can be interconnected with other package layers.

A second underfill is formed in the space between the second flip mounting layer 118 and the first wiring and package layer. More specifically, the space between the chip in second flip mounting layer 118 and the second sealant layer 106 is filled with a filling material to form the second underfill.

In certain embodiments, the filling material forming the underfill is a polymer epoxy resin. The polymer epoxy resin may have a desired fluidity and can be used to fully fill the gap between the flip chip and the second sealant layer 106 to avoid reliability issues such as internal voids in the subsequently formed layers. The filling material may be filled using dispensing method or other filling means.

Further, the second flip mounting layer 118 is sealed or encapsulated with the third sealant layer 109. The second flip mounting layer 118, the solder bumps 119, and the third sealant layer 109 may be referred as the top flip package layer.

Figure 16:
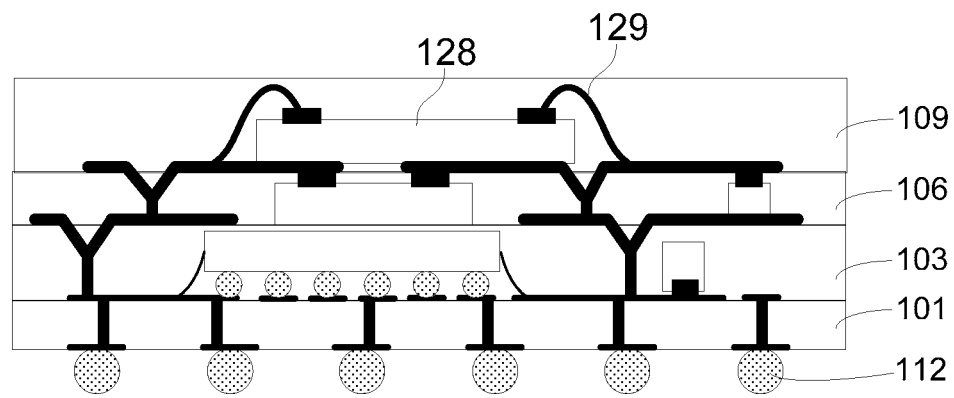
FIG. 16 illustrates another exemplary system-level packaging structure consistent with the disclosed embodiments.

FIG. 16 illustrate another exemplary of system-level packaging structure. As shown in FIG. 16, a wire-bonding package layer is formed on top of the first wiring and package layer instead of the second wiring and package layer.

More particularly, a straight mounting layer 128 is formed on the second sealant layer 106 over the second wiring layer 107. Similar to the first straight mounting layer 105, the straight mounting layer 128 may also include various components, such as chips and/or passive device. For example, a chip is included in the straight mounting layer 128. The chip and other component in the straight mounting layer 128 may be connected to the second wiring layer 107 by wires using a wire-bonding process. More specifically, the wires 129 are interconnected with the second horizontal wiring of the second wiring layer 107 such that components in the straight mounting layer 128 can be interconnected with other package layers.

Further, the straight mounting layer 128 is sealed or encapsulated with the third sealant layer 109. The straight mounting layer 128, the wires 129, and the third sealant layer 109 may be referred as the top wire-bonding package layer.

The disclosed systems and methods may provide many advantageous IC packaging applications. The internal wiring of the substrate further provides system integration and the system functions are outputted through planted connection balls. In addition, because the sealant layers have similar thickness to the mounting layers and have desired insulation and isolation performance, the integration degree of the system-level packaging structure may be substantially increased. Other applications and advantages are obvious to those skilled in the art.

What is claimed is:

1. A 3D system-level packaging method, comprising:
   providing a packaging substrate having a upper functional surface and a bottom functional surface with wiring arrangement within the packaging substrate and between the upper functional surface and the bottom functional surface;
   forming at least one flip package layer on the upper functional surface of the packaging substrate, wherein a flip package layer of the at least one flip package layer is formed by subsequently forming a first flip mounting layer with a first functional surface including one or more chips and one or more passive devices, an underfill, a first sealant layer encapsulating the first flip mounting layer, and a first wiring layer,
      wherein the first wiring layer includes vertical wiring extending through the first sealant layer and directly contacting with the upper functional surface of the packaging substrate, and horizontal wiring connected with the vertical wiring on top of the first sealant layer,
      the upper functional surface of the packaging substrate is connected with the one or more chips of the flip package layer via functional solder joints, and
      the underfill is in between of the upper functional surface of the packaging substrate and the one or more chips of the flip package layer, and is filled in gaps of the functional solder joints;
   forming at least one wiring and package layer on the flip package layer, wherein a wiring and package layer of the at least one wiring and package layer is formed by subsequently:
      forming a straight mounting layer with a second functional surface on top of the first sealant layer of the flip package layer, wherein the straight mounting layer includes one or more chips, one or more passive devices, and bonding pads on the one or more chips and on the one or more passive devices, and wherein the second functional surface of the straight mounting layer is opposite to the first functional surface of the first flip mounting layer;
      forming a second sealant layer encapsulating at least the one flip package layer, the straight mounting layer, and exposing the bonding pads, wherein the second sealant layer of the wiring and package layer has a top surface that is coplanar with a top surface of the bonding pads and is above a top surface of the one or more chips and the one or more passive devices of the straight mounting layer; and
      forming a second wiring layer, wherein the second wiring layer includes vertical wiring extending through the second sealant layer of the wiring and package layer and directly contacting the horizontal wiring of the first wiring layer, and horizontal wiring on top of the second sealant layer of the wiring and package layer for connecting the vertical wiring of the second wiring layer with the bonding pads of the straight mounting layer; and
   planting connection balls on the bottom functional surface of the packaging substrate.

2. The method according to claim 1, wherein forming the at least one flip package layer further includes:
   attaching functional surfaces of chips and passive devices on the packaging substrate to form the first flip mounting layer on the packaging substrate;
   filling space between the chips in first flip mounting layer and the packaging substrate with a filling material to form the underfill;
   forming the first sealant layer on top of and contacting the packaging substrate, and encapsulating the first flip mounting layer; and
   forming the first wiring layer on the first sealant layer.

3. The method according to claim 2, wherein forming the first wiring layer on the first sealant layer further includes:
   forming first vias in the first sealant layer;
   filling conductive material in the first vias to form first vertical wiring, which is used to realize electrical connection between the flip package layer and the packaging substrate and other package layers;
   forming first horizontal wiring on the first sealant layer connecting the first vertical wiring.

4. The method according to claim 1, wherein forming the at least one wiring and package layers further includes:
   attaching a first straight mounting layer on the first sealant layer with functional surface facing up;
   forming a second sealant layer on the first sealant layer at a same side attached with the first straight mounting layer, encapsulating the first flip mounting layer and exposing bonding pads of chips and passive devices in the first straight mounting layer; and
   forming a second wiring layer on the second sealant layer.

5. The method according to claim 4, wherein forming the second wiring layer on the second sealant layer further includes:
   forming second vias in the second sealant layer;
   filling conductive material in the second vias to form second vertical wiring, which is used to realize electrical connection between the wiring and package layer and other package layers;
   forming second horizontal wiring on the second sealant layer connecting the second vertical wiring, the second horizontal wiring being used to realize electrical connection among components in the wiring and package layer.

6. The method according to claim 1, wherein:
   the first functional surface and the second functional surface both have bonding pads; and
   a pad distance for the bonding pads on the first functional surface is less than a pad distance for the bonding pads on the second functional surface.

7. The method according to claim 1, wherein:
each of the first flip mounting layer and the straight mounting layer includes one or more chips and one or more of capacitors, resistors, and inductors.

8. The method according to claim 1, further including:
forming a top sealant layer on a top-level wiring and package layer of the at least one wiring and package layer.

9. The method according to claim 1, further comprising:
forming a top flip package layer, wherein forming the top flip package layer further includes:
attaching a second flip mounting layer on the wiring and package layer with its functional surface flipped, such that the straight mounting layer is sandwiched between the first flip mounting layer and the second flip mounting layer and the functional surface of the straight mounting layer is facing the functional surface of the second flip mounting layer;
filling space between chips in the second flip mounting layer and the wiring and package layer with a filling material to form a second underfill; and
forming a third sealant layer on the wiring and package layer to encapsulate the second flip mounting layer, wherein the horizontal wiring of the wiring and package layer contacts the third sealant layer.

10. The method according to claim 1, further comprising:
forming a top wire-bonding package layer, wherein forming the top wire-bonding package further includes:
attaching a wire-bonding mounting layer on the wiring and package layer with its functional surface facing up, such that the straight mounting layer is sandwiched between the first flip mounting layer and the wire-bonding mounting layer and the functional surface of the straight mounting layer face a same direction as the functional surface of the wire-bonding mounting layer;
connecting bonding pads of chips in the straight mounting layer to the wiring and package layer with wires using wire-bonding process; and
forming a third sealant layer on the wiring and package layer to encapsulate the wire-bonding package layer.

11. The method according to claim 1, wherein the at least one wiring and package layer includes two adjacent wiring and package layers including:
a lower wiring and package layer; and
an upper wiring and package layer stacked on the lower wiring and package layer, wherein the horizontal wiring of the lower wiring and package layer contacts a bottom surface of the straight mounting layer of the upper wiring and package layer, and both of the sealant layer and the horizontal wiring of the lower wiring and package layer contact the sealant layer of the upper wiring and package layer.

12. The method according to claim 1, wherein, for the wiring and package layer, the horizontal wiring of the second wiring layer on top of the second sealant layer and the bonding pads is substantially entirely horizontal.

13. The method according to claim 1, wherein the first sealant layer of the flip package layer and the second sealant layer of the wiring and package layer are made of a material including epoxy and are formed by turn injection, compression, or printing.

14. The method according to claim 2, further comprising:
forming a top flip package layer by attaching a second flip mounting layer on the wiring and package layer with its functional surface facing down, such that the straight mounting layer is sandwiched between the first flip mounting layer and the second flip mounting layer and the functional surface of the straight mounting layer face the functional surface of the second flip mounting layer.

15. The method according to claim 2, wherein a top surface of the first sealant layer of one flip package layer is above a top surface of the flip mounting layer and is substantially entirely horizontal.

16. The method according to claim 10, wherein the bonding pads of chips in the straight mounting layer are connected to the horizontal wiring of the wiring and package layer with wires.

17. The method according to claim 1, wherein the vertical wiring of the second wiring layer has a Y-shape.

18. The method according to claim 9, wherein:
the horizontal wiring of the second wiring layer of the wiring and package layer is connected with the chips of the top flip package layer via functional solder joints; and
the second underfill is in between of the horizontal wiring of the second wiring layer of the wiring and package layer and the chips of the top flip package layer, and is filled in gaps of the functional solder joints.

19. The method according to claim 1, wherein forming at least one wiring and package layer on the flip package layer further comprises:
forming a second straight mounting layer with a third functional surface on top of the second sealant layer of the wiring and package layer, wherein the second straight mounting layer includes one or more chips, one or more passive devices, and bonding pads on the one or more chips and on the one or more passive devices;
forming a third sealant layer encapsulating at least the wiring and package layer, the second straight mounting layer, and exposing the bonding pads, wherein the third sealant layer has a top surface that is coplanar with a top surface of the bonding pads and is above a top surface of the one or more chips and the one or more passive devices of the second straight mounting layer; and
forming a third wiring layer, wherein the third wiring layer includes vertical wiring extending through the third sealant layer and directly contacting the horizontal wiring of the second wiring layer, and horizontal wiring on top of the third sealant layer for connecting the vertical wiring of the third wiring layer with the bonding pads of the second straight mounting layer.

* * * * *